(12) United States Patent
Xu et al.

(10) Patent No.: US 11,210,989 B2
(45) Date of Patent: Dec. 28, 2021

(54) ARRAY SUBSTRATE, DISPLAY PANEL AND DISPLAY DEVICE

(71) Applicants: Beijing BOE Technology Development Co., Ltd., Beijing (CN); BOE Technology Group Co., Ltd., Beijing (CN)

(72) Inventors: Chen Xu, Beijing (CN); Xueguang Hao, Beijing (CN); Yong Qiao, Beijing (CN); Xinyin Wu, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/945,110

(22) Filed: Jul. 31, 2020

(65) Prior Publication Data

US 2021/0193013 A1 Jun. 24, 2021

(30) Foreign Application Priority Data

Dec. 24, 2019 (CN) .......................... 201922360428.8

(51) Int. Cl.
*G09G 3/32* (2016.01)
*G09G 3/20* (2006.01)
(Continued)

(52) U.S. Cl.
CPC ......... *G09G 3/2003* (2013.01); *G09G 3/3233* (2013.01); *G09G 3/3266* (2013.01);
(Continued)

(58) Field of Classification Search
CPC .. G09G 3/30; G09G 3/32; G09G 3/20; G09G 3/3258; G09G 3/3266; G09G 3/3291;
(Continued)

(56) References Cited

U.S. PATENT DOCUMENTS

| 2013/0135845 A1* | 5/2013 | Matsui .................... G09F 13/04 362/97.1 |
| 2013/0161595 A1* | 6/2013 | Kim .................... H01L 27/3216 257/40 |

(Continued)

*Primary Examiner* — Pegeman Karimi
(74) *Attorney, Agent, or Firm* — Arent Fox LLP; Michael Fainberg

(57) ABSTRACT

Disclosed are an array substrate, a display panel and a display device. The display panel includes a plurality of sub-pixel regions; each of the sub-pixel regions includes a pixel driving circuit, a white electroluminescent device connected with the pixel driving circuit and a color resist layer corresponding to the sub-pixel region; the plurality of sub-pixel regions include a first-color sub-pixel region, a second-color sub-pixel region and a third-color sub-pixel region; a width-to-length ratio of a channel region of the driving transistor in the first-color sub-pixel region is greater than a width-to-length ratio of a channel region of the driving transistor in the second-color sub-pixel region, and the width-to-length ratio of the channel region of the driving transistor in the second-color sub-pixel region is greater than a width-to-length ratio of a channel region of the driving transistor in the third-color sub-pixel region.

20 Claims, 4 Drawing Sheets

(51) Int. Cl.
   *G09G 3/3275*   (2016.01)
   *G09G 3/3266*   (2016.01)
   *G09G 3/3233*   (2016.01)
   *H01L 27/32*    (2006.01)

(52) U.S. Cl.
   CPC ....... *G09G 3/3275* (2013.01); *H01L 27/3213* (2013.01); *H01L 27/3216* (2013.01); *H01L 27/3218* (2013.01); *G09G 2300/0452* (2013.01); *G09G 2330/021* (2013.01)

(58) Field of Classification Search
   CPC ....... G09G 2320/02; G09G 2300/0443; G09G 3/34; H01L 27/32; H01L 27/3262; H01L 29/78; H01L 29/78696; H01L 29/7869; H01L 27/1225
   See application file for complete search history.

(56) References Cited

U.S. PATENT DOCUMENTS

| | | | |
|---|---|---|---|
| 2015/0311261 A1* | 10/2015 | Choi | H01L 27/3216 257/40 |
| 2016/0033812 A1* | 2/2016 | Lu | G02F 1/133345 349/106 |
| 2016/0099293 A1* | 4/2016 | Jung | H01L 27/3213 257/40 |
| 2019/0122599 A1* | 4/2019 | Wu | H01L 27/124 |
| 2020/0357335 A1* | 11/2020 | Yu | H01L 27/3216 |
| 2021/0011350 A1* | 1/2021 | Wu | G02F 1/1368 |

* cited by examiner

ARRAY SUBSTRATE, DISPLAY PANEL AND DISPLAY DEVICE

CROSS REFERENCE TO RELATED APPLICATION

This application claims priority to Chinese Patent Application No. 201922360428.8, filed with the Chinese Patent Office on Dec. 24, 2019. The entire disclosure of the above application is incorporated herein by reference.

FIELD

The present disclosure relates to the technical field of display and in particular to an array substrate, a display panel and a display device.

BACKGROUND

An organic light emitting diode has various advantages such as active luminescence, high brightness, ultrathinness, low power consumption, large viewing angle and wide working temperature range, so that the application of the organic light emitting diode to a display device is widely concerned. A large-sized organic light emitting display panel realizes color display under the coordination of a white electroluminescent device and a color resist layer.

SUMMARY

The present disclosure discloses an array substrate, a display panel and a display device.

In a first aspect, an embodiment of the present disclosure provides an array substrate, including:
a base substrate; and
a plurality of sub-pixel regions on the base substrate;
wherein each of the sub-pixel regions includes a pixel driving circuit; a white electroluminescent device connected with the pixel driving circuit; and a color resist layer corresponding to the each sub-pixel region; wherein different sub-pixel regions correspond to different color resist layers with different colors; wherein the pixel driving circuit includes a driving transistor, a data writing transistor and a storage capacitor connected between a gate of the driving transistor and a drain of the driving transistor, the gate of the driving transistor is connected with a drain of the data writing transistor, a source of the driving transistor is connected with a first power line, a gate of the data writing transistor is connected with a scanning signal line, and a source of the data writing transistor is connected with a data line;
wherein the plurality of sub-pixel regions at least includes a first-color sub-pixel region, a second-color sub-pixel region, and a third-color sub-pixel region; wherein a width-to-length ratio of a channel region of a driving transistor in the first-color sub-pixel region is greater than a width-to-length ratio of a channel region of a driving transistor in the second-color sub-pixel region, and the width-to-length ratio of the channel region of the driving transistor in the second-color sub-pixel region is greater than a width-to-length ratio of a channel region of a driving transistor in the third-color sub-pixel region; and
wherein a width-to-length ratio of a channel region of a driving transistor refers to a ratio of a width to a length of an overlapped region between a semiconductor layer of the driving transistor and a gate of the driving transistor, a width of the channel region refers to a dimension of the overlapped region in an extension direction of the gate of the driving transistor, and a length of the channel region refers to a dimension of the overlapped region in an extension direction of the semiconductor layer of the driving transistor.

In some embodiments, widths of channel regions of driving transistors in the sub-pixel regions of different colors are the same; and
a length of the channel region of the driving transistor in the first-color sub-pixel regions is smaller than a length of the channel region of the driving transistor in the second-color sub-pixel region, and the length of the channel region of the driving transistor in the second-color sub-pixel region is smaller than a length of the channel region of the driving transistor in the third-color sub-pixel region.

In some embodiments, lengths of channel regions of driving transistors in the sub-pixel regions of different colors are the same; and
a width of the channel region of the driving transistor in the first-color sub-pixel regions is greater than a width of the channel region of the driving transistor in the second-color sub-pixel region, and the width of the channel region of the driving transistor in the second-color sub-pixel regions is greater than a width of the channel region of the driving transistor in the third-color sub-pixel region.

In some embodiments, the first-color sub-pixel region is a red sub-pixel region, the second-color sub-pixel region is a green sub-pixel region, and the third-color sub-pixel region is a blue sub-pixel region.

In some embodiments, the sub-pixel regions further include a white sub-pixel region; and
a width-to-length ratio of a channel region of a driving transistor in the white sub-pixel region is smaller than the width-to-length ratio of the channel region of the driving transistor in the blue sub-pixel region.

In some embodiments, the pixel driving circuit further includes a compensation transistor;
a gate of the compensation transistor is connected with a compensation scanning line, a drain of the compensation transistor is connected with a compensation line, and a source of the compensation transistor is connected with the drain of the driving transistor; the compensation transistor is configured to acquire a threshold voltage and a mobility of the driving transistor under a control of a signal of the compensation scanning line; and
a width-to-length ratio of a channel region of a compensation transistor in the first-color sub-pixel region is greater than a width-to-length ratio of a channel region of the compensation transistor in the second-color sub-pixel region, and the width-to-length ratio of the channel region of the compensation transistor in the second-color sub-pixel region is greater than a width-to-length ratio of a channel region of the compensation transistor in the third-color sub-pixel region.

In some embodiments, the array substrate includes a semiconductor layer, where the semiconductor layer includes a first region, a second region and a third region;
the first region includes parts, in channel regions, of semiconductor layers of the driving transistor, the data writing transistor and the compensation transistor;
the second region includes parts, in non-channel regions, of the semiconductor layers of the driving transistor, the data writing transistor and the compensation transistor; and
the third region includes a first electrode of the storage capacitor, and the first electrode doesn't overlap with the scanning signal line and gates of the driving transistor, the data writing transistor and the compensation transistor.

In some embodiments, a second electrode of the storage capacitor includes a first metal electrode on a side, close to the base substrate, of the semiconductor layer and a second metal electrode on a side, away from the base substrate, of the semiconductor layer, and the first metal electrode is electrically connected with the second metal electrode; and the first electrode overlaps with the first metal electrode and the second metal electrode.

In some embodiments, an orthographic projection of the first metal electrode on the base substrate covers an orthographic projection of the first electrode on the base substrate and covers an orthographic projection of the second metal electrode on the base substrate.

In some embodiments, the compensation line is arranged in the same layer as the first metal electrode.

In some embodiments, the array substrate further includes a gate layer;

the gate layer includes: the scanning signal line extending along a first side of the sub-pixel regions;

the compensation scanning line extending along a second side of the sub-pixel regions; and a connecting wiring electrically connected with the storage capacitor, where the connecting wiring is between the scanning signal line and the compensation scanning line, and close to the first side, and the connecting wiring is in same extension direction as the scanning signal line and the compensation scanning line;

where the first side and the second side are opposite sides of the sub-pixel regions.

In some embodiments, the array substrate further includes a source/drain layer on a side, away from the base substrate, of the gate layer;

the source/drain layer includes: the data line extending along a third side of the sub-pixel regions; the first power line extending along a fourth side of the sub-pixel regions; and the second metal electrode between the data line and the first power line;

where the third side and the fourth side are opposite sides of the sub-pixel regions, and the first side and the third side are perpendicular to each other.

In a second aspect, an embodiment of the present disclosure further provides an array substrate including:

a base substrate;

a plurality of sub-pixel regions on the base substrate, where each of the sub-pixel regions includes a pixel driving circuit, a white electroluminescent device connected with the pixel driving circuit, and a color resist layer corresponding to the each sub-pixel region; where different sub-pixel regions correspond to different color resist layers with different colors;

where the plurality of sub-pixel regions at least include a first-color sub-pixel region, a second-color sub-pixel region and a third-color sub-pixel region; and an area of the first-color sub-pixel region is greater than an area of the second-color sub-pixel region, and the area of the second-color sub-pixel region is greater than an area of the third-color sub-pixel region.

In some embodiments, the first-color sub-pixel region is a red sub-pixel region, the second-color sub-pixel region is a green sub-pixel region, and the third-color sub-pixel region is a blue sub-pixel region.

In some embodiments, the plurality of sub-pixel regions further include a white sub-pixel region: and an area of the white sub-pixel region is smaller than the area of the blue sub-pixel region.

In a third aspect, an embodiment of the present disclosure further provides a display panel including the array substrate according to the embodiments in the first aspect.

In a fourth aspect, an embodiment of the present disclosure further provides a display panel including the array substrate according to the embodiments in the second aspect.

In a fifth aspect, an embodiment of the present disclosure further provides a display device including the display panel according to the embodiments in the third aspect.

In a sixth aspect, an embodiment of the present disclosure further provides a display device including the display panel according to the embodiments in the fourth aspect.

DETAILED DESCRIPTION

Figure 1:
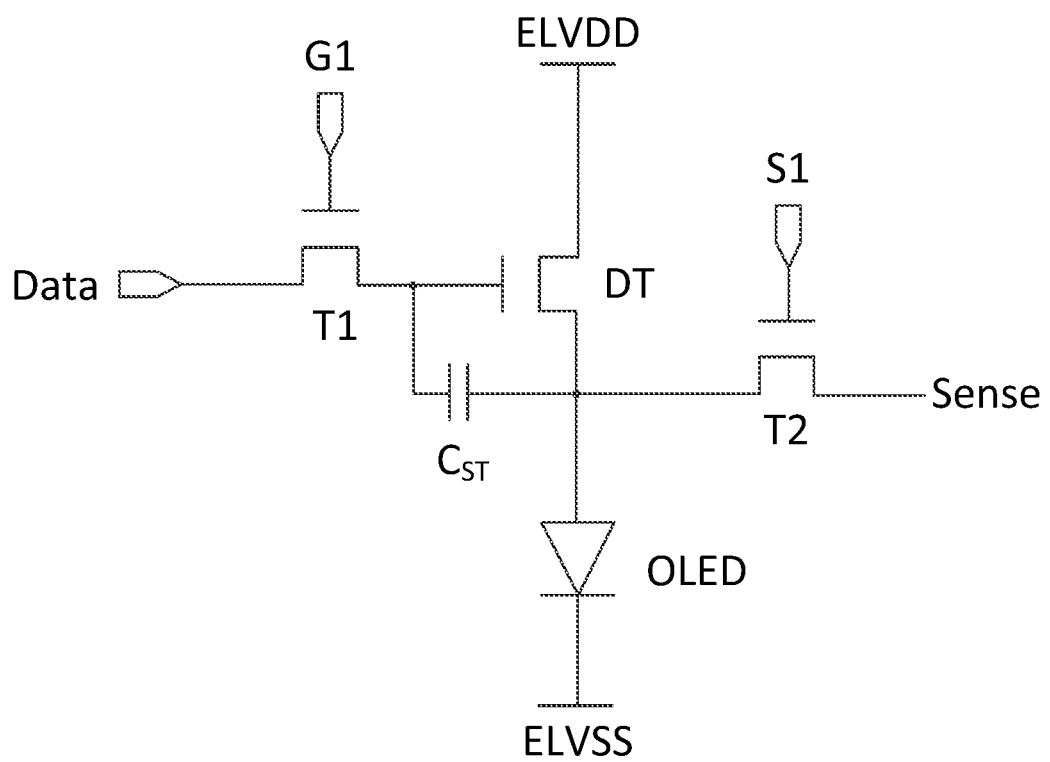
FIG. 1 is a schematic structural diagram of a pixel circuit according to an embodiment of the present disclosure.

In the related art, a large-sized organic light emitting display panel realizes color display under the coordination of a white electroluminescent device and a color resist layer. However, in the related art, there are differences between white light generated by the white electroluminescent device and a standard white light, and the differences are particularly reflected in differences between a color within a certain wavelength range in components of the white light and a color within a corresponding wavelength range of the corresponding standard white light, as a result, corresponding light loss conditions are different after the white light and the standard white light penetrate through the respective color resist, sub-pixels of different colors have different light emitting brightness when the same data voltage is input, and thus, the display quality of a display panel is lowered.

Based on a display panel in the related art, the problem that there are differences in brightness of sub-pixels of different colors exists when the same voltage data is input, and therefore, embodiments of the present disclosure provide an array substrate, a display panel and a display device. To make the objects, technical solutions and advantages of the present disclosure clearer, the detailed descriptions of the array substrate, the display panel and the display device provided by the embodiments of the present disclosure are shown below in conjunction with the accompanying drawings. It should be understood that the preferred embodiments described below are merely intended for a purpose for illustration, but are not intended to limit the present disclosure. Moreover, the embodiments in the present application and features in the embodiments may be combined with each other without conflicts.

Unless otherwise defined, technical or scientific terms used in the present disclosure shall have the ordinary meanings understood by the ordinary skill in the art to which the present disclosure pertains. The terms "first", "second" and the like used in the present disclosure do not indicate any order, quantity or importance, but are only used to distinguish different components. Words such as "include" or "contain" indicate that an element or item appearing before such a word covers listed elements or items appearing after the word and equivalents thereof, and does not exclude other elements or items. Words such as "connection" or "connected" are not limited to physical or mechanical connections, but may include electrical connections, whether direct or indirect. "upper", "lower", "left", "right" and the like are merely intended to explain a relative position relation, and after an absolute position of a described object is changed, the relative position relation may also be changed accordingly.

The shapes and sizes of all components in the accompanying drawings do not reflect the true scale, and are merely intended to schematically illustrate the content of the present disclosure.

Figure 2:
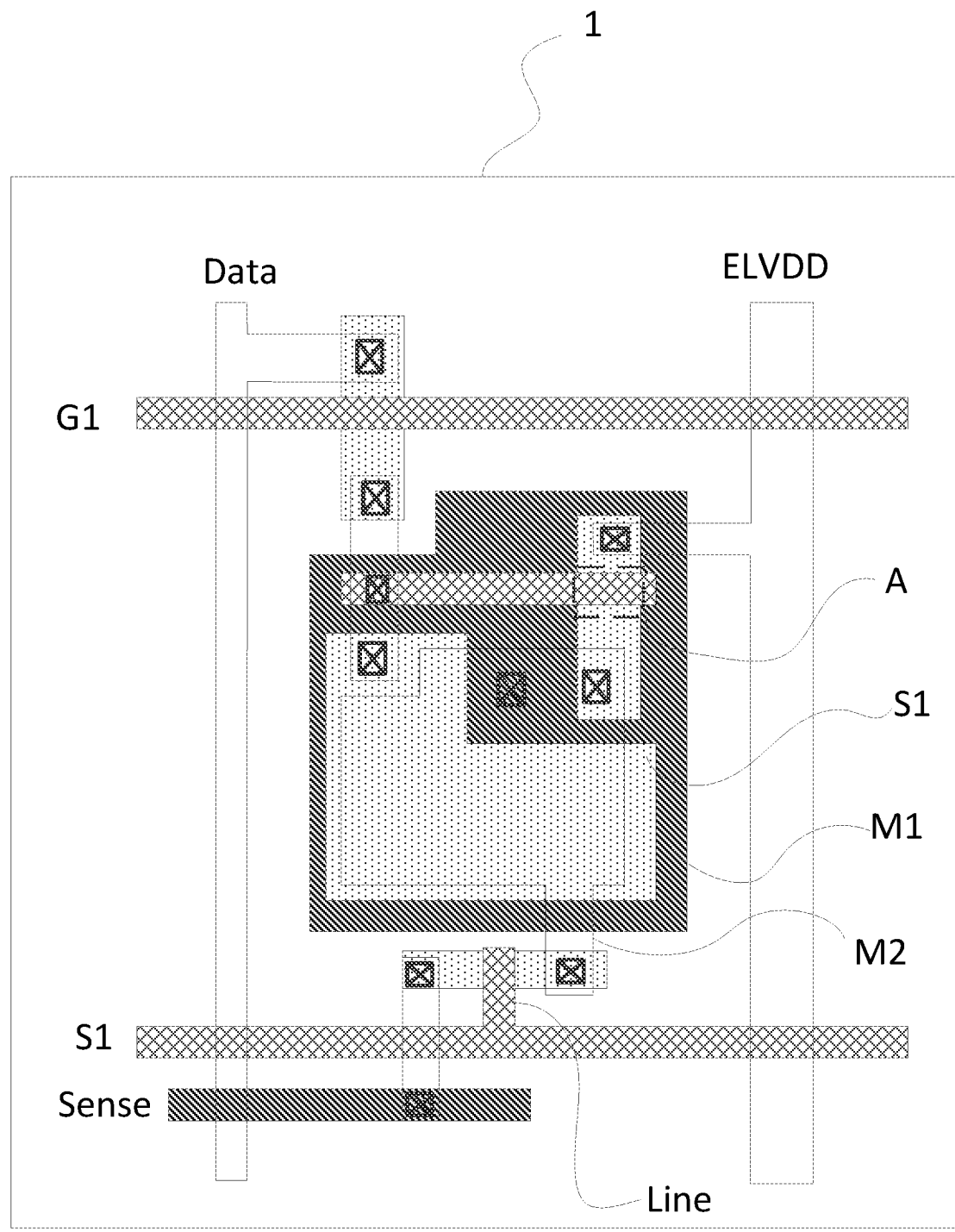
FIG. 2 is a schematic structural diagram of a circuit board in one sub-pixel region according to an embodiment of the present disclosure.

In some embodiments, an embodiment of the present disclosure provides an array substrate, as shown in FIG. 1 and FIG. 2, the array substrate includes a base substrate 1 and a plurality of sub-pixel regions disposed on the base substrate 1, and each of the sub-pixel regions includes a pixel driving circuit, a white electroluminescent device OLED connected with the pixel driving circuit and a color resist layer (not specifically shown in the figure) corresponding to the each sub-pixel region, where different sub-pixel regions correspond to different color resist layers with different colors.

The pixel driving circuit includes a driving transistor DT, a data writing transistor T1 and a storage capacitor Cst, where the storage capacitor Cst is connected between a gate of the driving transistor DT and a drain of the driving transistor DT, the gate of the driving transistor DT is connected with a drain of the data writing transistor T1, a source of the driving transistor DT is connected with a first power line ELVDD, a gate of the data writing transistor T1 is connected with a scanning signal line G1, and a source of the data writing transistor T1 is connected with a data line Data.

Figure 3:
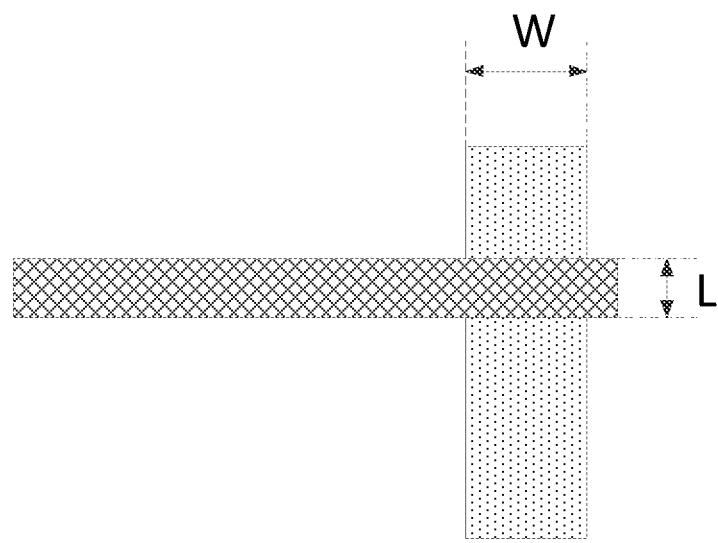
FIG. 3 is a schematic local structural diagram of a channel region according to an embodiment of the present disclosure.

The plurality of sub-pixel regions at least includes a first-color sub-pixel region, a second-color sub-pixel region and a third-color sub-pixel region. The width-to-length ratios of channel regions A of the driving transistors DT in the first-color sub-pixel regions are greater than those of channel regions A of the driving transistors DT in the second-color sub-pixel regions, and the width-to-length ratios of the channel regions A of the driving transistors DT in the second-color sub-pixel regions are greater than those of channel regions A of the driving transistors DT in the third-color sub-pixel regions; and as shown in FIG. 2 and FIG. 3, the width-to-length ratio W/L of the channel region A of the driving transistor DT refers to a ratio of a width W to a length L of an overlapped region between a semiconductor layer of the driving transistor DT and the gate of the driving transistor DT, the width of the channel region A refers to a dimension of the overlapped region in an extension direction of the gate of the driving transistor DT, and the length of the channel region A refers to a dimension of the overlapped region in an extension direction of the semiconductor layer of the driving transistor DT.

In some embodiments, there are differences between a white electroluminescent device in the related art and a standard white electroluminescent device on certain wavelengths, which results in differences in light emitting brightness corresponding to sub-pixel regions of various colors when the same data voltage is provided, and therefore, due to the design of the channel regions of the driving transistors in the pixel driving circuits in the first-color sub-pixel regions, the second-color sub-pixel regions and the third-color sub-pixel regions, the width-to-length ratios of the channel regions in the sub-pixel regions with low light emitting brightness are increased, thereby increasing driving currents provided by the driving transistors to compensate the loss on such a waveband and ensuring that the light emitting brightness of sub-pixel regions of various colors tends to be consistent under the drive of the same data voltage to improve the display quality.

It should be noted that, for the above first-color sub-pixel regions, second-color sub-pixel regions and third-color sub-pixel regions in the array substrate in the related art, under the drive of the same data voltage, the light emitting brightness of the first-color sub-pixel regions is lower than that of the second-color sub-pixel regions, and the light emitting brightness of the second-color sub-pixel regions is lower than that of the third-color sub-pixel regions. Therefore, the dimensions of the channel regions of the driving transistors are designed in the present disclosure, the width-to-length ratios of the channel regions of the driving transistors in the first-color sub-pixel region is greater than those of the channel regions of the driving transistors in the second-color sub-pixel regions, and the width-to-length ratios of the channel regions of the driving transistors in the second-color sub-pixel region is greater than those of the channel regions of the driving transistors in the third-color sub-pixel regions. The width-to-length ratios of the channel regions in sub-pixel regions of different colors are designed to be different, so as to compensate different losses of different colors.

In some embodiments, the widths of the channel regions of the driving transistors in sub-pixel regions of different colors are the same; and the length of the channel region of the driving transistor in the first-color sub-pixel region is smaller than the length of the channel region of the driving transistor in the second-color sub-pixel region, and the length of the channel region of the driving transistor in the second-color sub-pixel region is smaller than the length of the channel region of the driving transistor in the third-color sub-pixel region.

In some embodiments, since the intensity of the driving current of the driving transistor is related to the width-to-length ratio of the channel region of the driving transistor, when other parameters are constant, the greater the width-to-length ratio of the channel region is, the higher the intensity of the driving current of the driving transistor is, the smaller the width-to-length ratio of the channel region is, and the lower the intensity of the driving current of the driving transistor is. Therefore, when the width of the channel region of the driving transistors in sub-pixel region of each color is a constant value, the width-to-length ratio of the channel region in sub-pixel region of each color can be determined by adjusting the length of the channel region of the driving transistor in sub-pixel region of each color, the smaller the length of the channel region of the driving transistor in sub-pixel region of each color is, the greater the width-to-length ratio of the channel region in sub-pixel region of each color is, and the higher the intensity of the driving current supplied to the corresponding white electroluminescent device is.

Therefore, in the embodiment of the present disclosure, when the widths of the channel regions of the driving transistors in sub-pixel regions of different colors are the same, the length of the channel region of the driving transistor in the first-color sub-pixel regions may be smaller than those of the channel region of the driving transistor in the second-color sub-pixel regions, and the length of the channel region of the driving transistor in the second-color sub-pixel regions may be smaller than those of the channel region of the driving transistor in the third-color sub-pixel regions.

The length of the channel region of the driving transistor in sub-pixel region of each color is further required be determined according to an actual brightness test as long as it meets the arrangement order of the dimensions provided in the above embodiment, the limitations thereof are omitted herein.

In some embodiments, the lengths of the channel regions of the driving transistors in the sub-pixel regions of different colors are the same; and the width of the channel region of the driving transistor in the first-color sub-pixel region is greater than the width of the channel region of the driving transistor in the second-color sub-pixel region, and the width of the channel region of the driving transistor in the second-color sub-pixel region is greater than the width of the channel region of the driving transistor in the third-color sub-pixel region.

In some embodiments, when the length of the channel region of the driving transistor in sub-pixel region of each color is a constant value, the width-to-length ratio of the channel region in sub-pixel region of each color can be determined by adjusting the width of the channel region of the driving transistor in sub-pixel region of each color, the greater the width of the channel region of the driving transistor in sub-pixel region of each color is, the greater the width-to-length ratio of the channel region in sub-pixel region of each color is, and the higher the intensity of the driving current supplied to the corresponding white electroluminescent device is.

Therefore, in some embodiments, when the lengths of the channel regions of the driving transistors in the sub-pixel regions of different colors are the same, the width of the channel region of the driving transistor in the first-color sub-pixel regions may be greater than those of the channel region of the driving transistor in the second-color sub-pixel regions, and the width of the channel region of the driving transistor in the second-color sub-pixel regions may be greater than those of the channel region of the driving transistor in the third-color sub-pixel regions. Due to the adoption of the above-mentioned design, the light emitting brightness of sub-pixel regions of various colors tends to be consistent when the same data voltage is applied.

The widths of the channel regions of the driving transistors in sub-pixel regions of each color are required to be determined according to an actual brightness test as long as it meets the arrangement order of the dimensions provided in the above embodiment, the limitations thereof are omitted herein.

Figure 4:
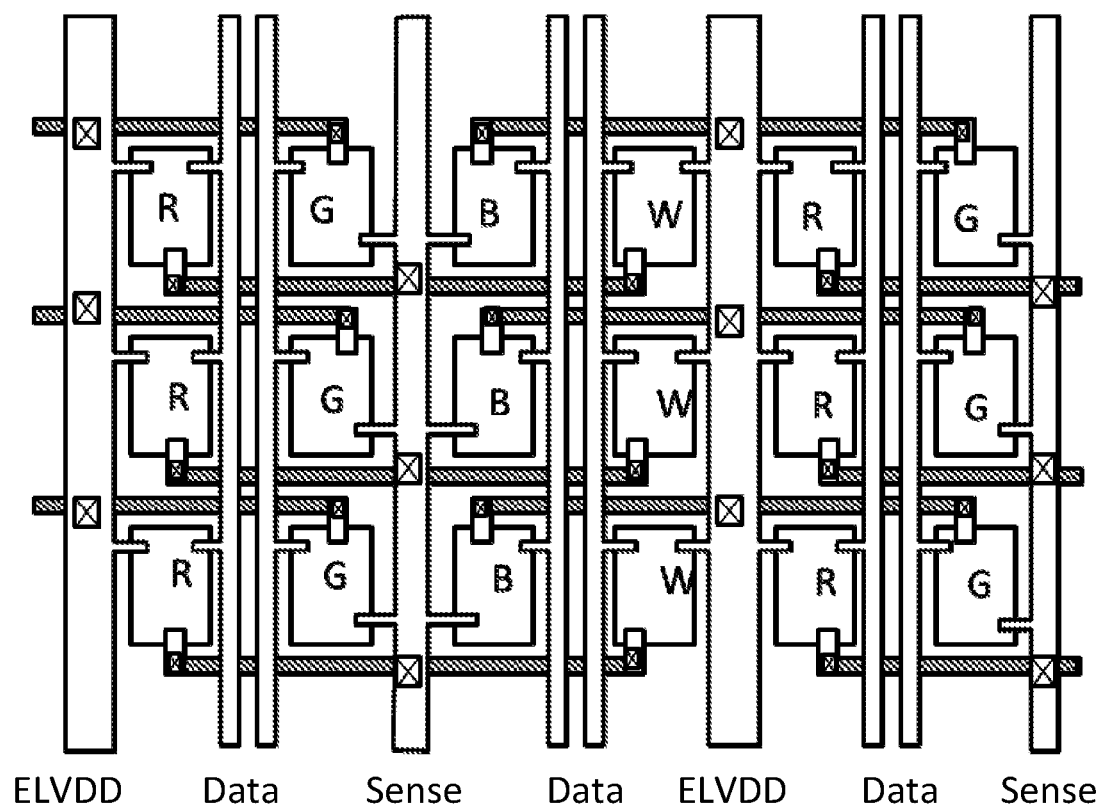
FIG. 4 is a schematic structural diagram of an array substrate according to an embodiment of the present disclosure.

In some embodiments, as shown in FIG. 4, the first-color sub-pixel region is red sub-pixel region R, the second-color sub-pixel region is green sub-pixel region G, and the third-color sub-pixel region is blue sub-pixel region B.

In some embodiments, based on a proportion occupied by light on each waveband in the white electroluminescent device in the related art, red light has the lowest light emitting intensity and blue light has the highest light emitting intensity under the drive of the same driving voltage after passing through the color resist layer, in this way, the width-to-length ratio of the channel region of the driving transistor in the red sub-pixel region is required to be set to be greater than the width-to-length ratio of the channel region of the driving transistor in the blue sub-pixel region, so that the insufficient light emitting intensity of the red light is compensated.

In some embodiments, as shown in FIG. 4 and FIG. 2, the sub-pixel regions further include a white sub-pixel region W. A width-to-length ratio of channel region A of the driving transistor DT in the white sub-pixel region W is smaller than a width-to-length ratio of the channel region A of the driving transistor DT in the blue sub-pixel region B.

In some embodiments, in order to further improve the display quality, the white sub-pixel regions may be set in the array substrate according to a preset rule, and the electroluminescent device itself emits white-light, so that no color resist layers are not arranged in the white sub-pixel regions or transparent color resist layers may be arranged in the white sub-pixel regions. In this way, the light emitting efficiency of white light is relatively high, and a display demand can be met as long as the width-to-length ratios of the channel regions of the driving transistors in the white sub-pixel regions are set to be relatively small.

In some embodiments, as shown in FIG. 1 and FIG. 2, the pixel driving circuit further includes a compensation transistor T2. A gate of the compensation transistor T2 is connected with a compensation scanning line S1, a drain of the compensation transistor T2 is connected with a compensation line Sense, and a source of the compensation transistor T2 is connected with the drain of the driving transistor DT. The compensation transistor T2 is configured to acquire a threshold voltage and a mobility of the driving transistor DT under the control of a signal of the compensation scanning line S1. A width-to-length ratio of channel region of a compensation transistor in the first-color sub-pixel region is greater than a width-to-length ratio of channel region of a compensation transistor in the second-color sub-pixel region, and the width-to-length ratio of the channel regions of the compensation transistors in the second-color sub-pixel region is greater than a width-to-length ratio of channel region of a compensation transistor in the third-color sub-pixel region.

In some embodiments, the compensation transistor is configured to acquire the threshold voltage and mobility of the driving transistor to compensate the driving transistor, so that the width-to-length ratio of the channel region of the compensation transistors can be changed with the width-to-length ratio of the channel region of the driving transistor in the pixel driving circuit, and thus the acquired threshold voltage and mobility are more accurate.

In some embodiments, as shown in FIG. 2, the array substrate includes a semiconductor layer. The semiconductor layer includes a first region, a second region and a third region; the first region includes parts, in channel regions, of semiconductor layers of the driving transistors, the data writing transistor and the compensation transistor; the second region includes parts, in non-channel regions, of the semiconductor layers of the driving transistor, the data writing transistor and the compensation transistor; and the third region includes first electrodes S1 of the storage capacitors, and the first electrodes S1 don't overlap with the scanning signal lines G1 and gates of the driving transistor, the data writing transistor and the compensation transistor.

In some embodiments, the conductivities of the semiconductor layers in the first region, the second region and the third region are sequentially increased so as to meet different demands of the different regions for the conductivities.

In some embodiments, the semiconductor layer may be a metal oxide layer. In some embodiments, an oxide containing In and Sn, an oxide containing W and In, an oxide containing W, In and Zn, an oxide containing Ti and In, an oxide containing Ti, In and Sn, an oxide containing In and Zn, an oxide containing Si, In and Sn, an oxide containing In, Ga and Zn and the like may be adopted.

When the metal oxide layer is an oxide semiconductor containing In, the carrier mobility (electron mobility) can be increased. In addition, the oxide semiconductor preferably contains an element M. The element M is preferably Al, Ga, Y or Sn and the like. Other elements which may be used as the element M include B, Si, Ti, Fe, Ni, Ge, Y, Zr, Mo, La, Ce, Nd, Hf, Ta, W and the like. It should be noted that the element M may be a combination of a plurality of the above elements. The element M is, for example, an element having high bond energy with O. The element M is an element having higher bond energy with O than In. Or, the element M is, for example, an element with a function of increasing an energy gap of the oxide semiconductor. In addition, the metal oxide layer preferably contains Zn, and the oxide semiconductor is easy to crystallize when containing Zn. During actual implementation, the oxide semiconductor is not limited to the oxide semiconductor containing In, may also be an oxide semiconductor not containing In, but containing Zn, Ga or Sn, such as a Zn—Sn oxide or a Ga—Sn oxide.

In the case that the metal oxide layer is an In-M-Zn metal oxide, it is preferable that the content of In is lower than 50 atomic %, and the content of M is higher than 50 atomic % when the sum of In and M is 100 atomic %. The metal oxide layer adopts an oxide with a large energy gap which is, for example, higher than 2.5 eV or lower than 4.2 eV; preferably, higher than 2.8 eV or lower than 3.8 eV; and more preferably, higher than 3 eV or lower than 3.5 eV. Preferably, the metal oxide layer is an oxide containing In, M and Zn, wherein M is Al, Ga or Sn.

In some embodiments, components of semiconductor layers of the driving transistors, the data writing transistor and the compensation transistor may be the same or approximately same, so that the production cost is reduced. The embodiments are not limited to this, and the components of the semiconductor layers of the three kinds of transistors may also be different from each other.

In some embodiments, the metal oxide layer may be single-layer, or double-layer or multi-layer. When being double-layer, the metal oxide layer includes a first oxide layer and a second oxide layer which are overlapped. The second oxide layer may have lower conductivity and a larger energy gap than the first oxide layer. The first oxide layer may be a main channel layer for electron migration, so as to be arranged to be close to a first gate, a second gate and a third gate. When being single-layer, the metal oxide layer is preferably made of an IGZO material.

In some embodiments, a part of the metal oxide layer is used as the semiconductor layers of the transistors, the other part of the metal oxide layer is used as first electrodes of the storage capacitors, and therefore, during conductor treatment, on one hand, channel directions and shapes of different sub-pixels may be distinguished to adapt to the design of different width-to-length ratios. On the other hand, it is possible that the metal oxide layer has different component content within different regions in one sub-pixel so as to meet a demand for different electrical characteristics.

The above conductor treatment is, after patterns such as the gates of the transistors are formed, to perform plasma process by using the gates of the transistors as masks, and process the metal oxide layer in the corresponding regions to form conductor layers. That is, the metal oxide layer may be divided into three regions, wherein the first region includes parts, located in the channel regions, of semiconductor layer patterns of the transistors; the second region includes parts, located in non-channel regions, of the semiconductor layer patterns of the transistors; and the third region includes a region where the first electrodes of the storage capacitors are located. In the present embodiment, the components of IGZO in the three regions are different. In the present embodiment, the O content of IGZO in the first region is lower than that of IGZO in the second region, and the O content of IGZO in the second region is lower than that of IGZO in the third region. The Zn content of IGZO in the first region is higher than Zn content of IGZO in the second region, and the Zn content of IGZO in the second region is higher than Zn content of IGZO in the third region.

An example of components of IGZO in the three regions is given in the following table, wherein Weight % represents a proportion of an element in an oxide, and Atomic % represents an atomic percentage of the element in the oxide.

| Element | First region | | Second region | | Third region | |
| --- | --- | --- | --- | --- | --- | --- |
| | Weight (%) | Atomic (%) | Weight (%) | Atomic (%) | Weight (%) | Atomic (%) |
| O | 11.82 | 40.24 | 19.47 | 55.39 | 23.35 | 60.94 |
| Zn | 25.68 | 21.40 | 19.61 | 13.65 | 18.72 | 11.95 |
| Ga | 28.38 | 22.18 | 26.51 | 17.31 | 25.66 | 15.37 |
| In | 34.12 | 16.18 | 34.4 | 13.63 | 32.24 | 11.72 |

The first region is the channel region of each of the transistors, the second region is a source/drain region of each of the transistors, and the third region is a electrode plate region of the storage capacitor. As shown in the above table, IGZO includes elements such as O, Zn, Ga and In, the first region is not subjected to plasma process due to being shielded by the gate, so that the relative weight ratio of the elements O:Zn:Ga:In is 11.82:25.68:28.38:34.12, and the relative atomic ratio of the elements O:Zn:Ga:In is 40.24:21.40:22.18:16.18. The third region is subjected to plasma process due to being not shielded, so that the relative weight ratio of the elements O:Zn:Ga:In is 23.35:18.72:25.66:32.24, and the relative atomic ratio of the elements O:Zn:Ga:In is 60.94:11.95:15.37:11.72. After plasma process, the weight and the atomic content of O in IGZO in the third region are greatly increased, the weight and the atomic content of Zn are reduced, and therefore, the conductivity of IGZO is improved. Although the second region is not shielded by the gate, the region is adjacent to the gate and is affected by the gate, the weight and the atomic content of O in IGZO in the second region are lower than the weight and the atomic content of O in the third region, the weight and the atomic content of Zn in the second region are higher than the weight and the atomic content of Zn in the third region, and therefore, the conductivity of IGZO in the second region is lower than that of IGZO in the third region. In addition, not only the content of the element O decides the conductivity type of IGZO, but also the content of Ga and In can also affect the electrical characteristics of IGZO. Generally, the content of In greatly affects the carrier concentration and the Hall mobility in IGZO, the carrier concentration and the Hall mobility are also increased with the increment of the content of In, but it does not mean the higher, the better. With the reduction of the content of Ga, the carrier concentration and the Hall mobility can also be increased.

Since parts of the metal oxide layer in the third region are used as the first electrodes of the storage capacitors, good conduction characteristics, namely relatively excellent conductor level is needed. When the gate is adopted as the mask to perform plasma process, theoretically, the farther the region is away from the gate, the better the conductivity level is, and the better the conduction characteristics are. Specifically, a distance from the first electrode to the gate may be selected according to an actual design condition, the limitations thereof are omitted herein.

In some embodiments, as shown in FIG. 2, a second electrode of the storage capacitor includes a first metal electrode M1 on a side, close to the base substrate 1, of the semiconductor layer and a second metal electrode M2 on a side, away from the base substrate 1, of the semiconductor layer. The first metal electrode M1 is electrically connected with the second metal electrode M2; and the first electrode S1 overlaps with the first metal electrode M1 and the second metal electrode M2.

In some embodiments, due to the above arrangement, the area of a region occupied by the storage capacitor can be reduced while the directly-facing area of the first electrode and the second electrode of the storage capacitor is increased, so that it is beneficial to the realization of high-pixel display.

In some embodiments, an orthographic projection of the first metal electrode on the base substrate covers an orthographic projection of the first electrode on the base substrate and covers an orthographic projection of the second metal electrode on the base substrate.

In some embodiments, as shown in FIG. 2, the compensation lines Sense may be arranged in the same layer as the first metal electrode M1, so that patterning can be performed by adopting one process, and furthermore, the process flow is simplified.

In addition, in some embodiments, as shown in FIG. 2, the array substrate further includes a gate layer. The gate layer includes: the scanning signal line G1 extending along a first side of the sub-pixel region; the compensation scanning line Sense extending along a second side of the sub-pixel region; and a connecting wiring Line electrically connected with the storage capacitor, where the connecting wiring Line is between the scanning signal line G1 and the compensation scanning line Sense and close to the first side, and the connecting wiring Line is in same extension direction as the scanning signal line G1 and the compensation scanning line Sense. The first side and the second side are opposite sides of the sub-pixel region.

The array substrate further includes a source/drain layer on the side of the gate layer away from the base substrate 1. The source/drain layer includes: the data line Data extending along a third side of the sub-pixel region; the first power line ELVDD extending along a fourth side of the sub-pixel region; and the second metal electrode M2 between the data line Data and the first power line ELVDD. The third side and the fourth side are opposite sides of the sub-pixel region, and the first side and the third side are perpendicular to each other.

The dimensions of patterns formed by the above gate layer and source/drain layer and a distance between the patterns may be selected according to an actual design demand of a circuit, the limitations thereof are omitted herein.

Based on the same inventive concept, an embodiment of the present disclosure further provides an array substrate including: a base substrate; a plurality of sub-pixel regions disposed on the base substrate, where each of the sub-pixel regions includes: a pixel driving circuit, a white electroluminescent device connected with the pixel driving circuit and a color resist layer corresponding to the each sub-pixel region; where different sub-pixel regions correspond to different color resist layers with different colors. The plurality of sub-pixel regions at least include: a first-color sub-pixel region, a second-color sub-pixel region and a third-color sub-pixel region; where an area of the first-color sub-pixel region is greater than an area of the second-color sub-pixel region, and the area of the second-color sub-pixel region is greater than an area of the third-color sub-pixel region.

In addition to the above embodiment in which the pixel circuits in sub-pixel regions of different colors are arranged to achieve the effect that light emitting intensities in sub-pixel regions of different colors tend to be consistent when the same data voltage is provided, the above purpose can also be achieved by designing the area of sub-pixel regions of different colors.

In some embodiments, it is possible that the area of the first-color sub-pixel region is greater than the area of the second-color sub-pixel region, and the area of the second-color sub-pixel region is greater than the area of the third-color sub-pixel region.

In some embodiments, there are differences between a white electroluminescent device in the related art and a standard white electroluminescent device on certain wavelengths, which results in differences in light emitting brightness corresponding to sub-pixel regions of various colors when sub-pixels of different colors provide the same data voltage, and therefore, due to the design of the areas of the first-color sub-pixel region, the second-color sub-pixel region and the third-color sub-pixel region in the present disclosure, the area of the sub-pixel regions with low light emitting brightness is increased, thereby increasing the light emitting intensity of light of the corresponding color to compensate the loss on such a waveband and ensuring that the light emitting brightness of sub-pixel regions of various colors tends to be consistent under the drive of the same data voltage, to improve the display quality.

It should be noted that the area increasing or reducing proportion may be adjusted according to the difference of the light emitting brightness in an actual detection process when the area of sub-pixel regions of different colors is adjusted, the limitations thereof are omitted herein.

In some embodiments, the first-color sub-pixel region is a red sub-pixel region, the second-color sub-pixel region is a green sub-pixel region, and the third-color sub-pixel region is a blue sub-pixel region.

In some embodiments, the plurality of sub-pixel regions further includes a white sub-pixel region: and the area of the white sub-pixel region is smaller than the area of the blue sub-pixel region.

In addition to the above description in which the pixel circuits or area proportions in sub-pixel regions of different colors may be respectively designed, both the pixel circuits and the area proportions in sub-pixel regions of different colors may be adjusted according to the above principle, and the way is selected according to an actual demand, the limitations thereof are omitted herein.

Based on the same inventive concept, an embodiment of the present disclosure further provides a display panel, including the array substrate provided by any one of the above embodiments.

Based on the same inventive concept, an embodiment of the present disclosure further provides a display device, including the display panel provided by the above-mentioned embodiment.

The display panel and the display device according to the embodiments of the present disclosure have all the advantages of the array substrates provided by the above embodiments, have the same or similar principles and implementation ways and may be implemented with reference to the embodiments of the array substrates provided by the above-mentioned embodiments, the descriptions thereof are omitted herein.

In some embodiments, the display device may be any one product or component with a display function, such as a mobile phone, a tablet personal computer, a television, a display, a notebook computer, a digital photo frame and a navigator.

The embodiments of the present disclosure provide the array substrate, the display panel and the display device. The display panel includes the base substrate and the plurality of sub-pixel regions on the base substrate; each of the sub-pixel regions includes the pixel driving circuit, the white electroluminescent device connected with the pixel driving circuit; and the color resist layers corresponding to the each sub-pixel region; wherein different sub-pixel regions correspond to different color resist layers with different colors; the plurality of sub-pixel regions at least include the first-color sub-pixel region, the second-color sub-pixel region and the third-color sub-pixel region; and the width-to-length ratio of the channel region of the driving transistor in the first-color sub-pixel region is greater than the width-to-length ratio of the channel region of the driving transistor in the second-color sub-pixel region, and the width-to-length ratio of the channel region of the driving transistor in the second-color sub-pixel region is greater than the width-to-length ratio of the channel region of the driving transistor in the third-color sub-pixel region. Due to the design of the channel region of the driving transistor in the pixel driving circuit in the first-color sub-pixel region, the second-color sub-pixel region and the third-color sub-pixel region, the width-to-length ratio of the channel region in the sub-pixel region with low light emitting brightness is increased, thereby increasing driving currents provided by the driving transistor, increasing the brightness of the corresponding white electroluminescent device, and ensuring that the light emitting brightness of sub-pixel regions of various colors tends to be consistent under the drive of the same data voltage.

Obviously, those skilled in the art can make modifications and variations to the present disclosure without departing from the spirit and scope of the present disclosure. Thus, the present disclosure is also intended to encompass these modifications and variations if such modifications and variations of the present disclosure are within the scope of the claims of the present disclosure and equivalents thereof.

The invention claimed is:

1. An array substrate, comprising:
a base substrate; and
a plurality of sub-pixel regions on the base substrate;
wherein each of the sub-pixel regions comprises:
   a pixel driving circuit;
   a white electroluminescent device connected with the pixel driving circuit; and
   a color resist layer corresponding to the each sub-pixel region;
   wherein different sub-pixel regions correspond to different color resist layers with different colors;
   wherein the pixel driving circuit comprises:
      a driving transistor;
      a data writing transistor; and
      a storage capacitor connected between a gate of the driving transistor and a first electrode of the driving transistor;
      wherein the gate of the driving transistor is connected with a first electrode of the data writing transistor, a second electrode of the driving transistor is connected with a first power line, a gate of the data writing transistor is connected with a scanning signal line, and a second electrode of the data writing transistor is connected with a data line;
wherein the plurality of sub-pixel regions at least comprise:
   a first-color sub-pixel region;
   a second-color sub-pixel region; and
   a third-color sub-pixel region;
   wherein a width-to-length ratio of a channel region of a driving transistor in the first-color sub-pixel region is greater than a width-to-length ratio of a channel region of a driving transistor in the second-color sub-pixel region, and the width-to-length ratio of the channel region of the driving transistor in the second-color sub-pixel region is greater than a width-to-length ratio of a channel region of a driving transistor in the third-color sub-pixel region; and
   wherein a width-to-length ratio of a channel region of a driving transistor refers to a ratio of a width to a length of an overlapped region between a semiconductor layer of the driving transistor and a gate of the driving transistor, a width of the channel region refers to a dimension of the overlapped region in an extension direction of the gate of the driving transistor, and a length of the channel region refers to a dimension of the overlapped region in an extension direction of the semiconductor layer of the driving transistor.

2. The array substrate according to claim 1, wherein widths of channel regions of driving transistors in sub-pixel regions of different colors are the same; and
a length of the channel region of the driving transistor in the first-color sub-pixel region is smaller than a length of the channel region of the driving transistor in the second-color sub-pixel region, and the length of the channel region of the driving transistor in the second-color sub-pixel region is smaller than a length of the channel region of the driving transistor in the third-color sub-pixel region.

3. The array substrate according to claim 2, wherein the first-color sub-pixel region is a red sub-pixel region, the second-color sub-pixel region is a green sub-pixel region, and the third-color sub-pixel region is a blue sub-pixel region.

4. The array substrate according to claim 3, wherein the sub-pixel regions further comprise a white sub-pixel region; and
a width-to-length ratio of a channel region of a driving transistor in the white sub-pixel region is smaller than a width-to-length ratio of the channel region of the driving transistor in the blue sub-pixel region.

5. The array substrate according to claim 1, wherein lengths of channel regions of driving transistors in sub-pixel regions of different colors are the same; and
a width of the channel region of the driving transistor in the first-color sub-pixel region is greater than a width of the channel region of the driving transistor in the second-color sub-pixel regions, and the width of the channel region of the driving transistor in the second-color sub-pixel region is greater than a width of the channel region of the driving transistor in the third-color sub-pixel region.

6. The array substrate according to claim 1, wherein the pixel driving circuit further comprises a compensation transistor;
   a gate of the compensation transistor is connected with a compensation scanning line, a first electrode of the compensation transistor is connected with a compensation line, and a second electrode of the compensation transistor is connected with the first electrode of the driving transistor; the compensation transistor is configured to acquire a threshold voltage and a mobility of the driving transistor under a control of a signal of the compensation scanning line; and
   a width-to-length ratio of a channel region of a compensation transistor in the first-color sub-pixel region is greater than a width-to-length ratio of a channel region of a compensation transistor in the second-color sub-pixel region, and the width-to-length ratio of the channel region of the compensation transistor in the second-color sub-pixel region is greater than a width-to-length ratio of a channel region of a compensation transistor in the third-color sub-pixel region.

7. The array substrate according to claim 6, further comprising a semiconductor layer, wherein the semiconductor layer comprises a first region, a second region and a third region;
   the first region comprises parts, in channel regions, of semiconductor layers of the driving transistor, the data writing transistor and the compensation transistor;
   the second region comprises parts, in non-channel regions, of the semiconductor layers of the driving transistor, the data writing transistor and the compensation transistor; and
   the third region comprises a first electrode of the storage capacitor, and the first electrode doesn't overlap with the scanning signal line and gates of the driving transistor, the data writing transistor and the compensation transistor.

8. The array substrate according to claim 7, wherein a second electrode of the storage capacitor comprises a first metal electrode on a side, close to the base substrate, of the semiconductor layer and a second metal electrode on a side, away from the base substrate, of the semiconductor layer, and the first metal electrode is electrically connected with the second metal electrode; and
   the first electrode overlaps with the first metal electrode and the second metal electrode.

9. The array substrate according to claim 8, wherein an orthographic projection of the first metal electrode on the base substrate covers an orthographic projection of the first electrode on the base substrate and covers an orthographic projection of the second metal electrode on the base substrate.

10. The array substrate according to claim 8, wherein the compensation line is arranged in the same layer as the first metal electrode.

11. The array substrate according to claim 8, further comprising a gate layer; wherein,
   the gate layer comprises: the scanning signal line extending along a first side of the sub-pixel regions;
   the compensation scanning line extending along a second side of the sub-pixel regions; and
   a connecting wiring electrically connected with the storage capacitor, wherein the connecting wiring is between the scanning signal line and the compensation scanning line and close to the first side, and the connecting wiring is in same extension direction as the scanning signal line and the compensation scanning line;
   wherein the first side and the second side are opposite sides of the sub-pixel regions.

12. The array substrate according to claim 11, further comprising a source/drain layer on a side, away from the base substrate, of the gate layer;
   wherein the source/drain layer comprises:
   the data line extending along a third side of the sub-pixel regions;
   the first power line extending along a fourth side of the sub-pixel regions; and
   the second metal electrode between the data line and the first power line;
   wherein the third side and the fourth side are opposite sides of the sub-pixel regions, and the first side and the third side are perpendicular to each other.

13. A display panel, comprising the array substrate according to claim 1.

14. A display device, comprising the display panel according to claim 13.

15. An array substrate, comprising:
   a base substrate; and
   a plurality of sub-pixel regions on the base substrate;
   wherein each of the sub-pixel regions comprises:
      a pixel driving circuit comprising a driving transistor;
      a white electroluminescent device connected with the pixel driving circuit; and
      a color resist layer corresponding to the each sub-pixel region;
      wherein different sub-pixel regions correspond to different color resist layers with different colors;
   wherein the plurality of sub-pixel regions at least comprise:
      a first-color sub-pixel region;
      a second-color sub-pixel region; and
      a third-color sub-pixel region; and
      wherein an area of the first-color sub-pixel region is greater than an area of the second-color sub-pixel region, and the area of the second-color sub-pixel region is greater than an area of the third-color sub-pixel region; and
      a width-to-length ratio of a channel region of a driving transistor in the first-color sub-pixel region is different from a width-to-length ratio of a channel region of a driving transistor in the second-color sub-pixel region and a width-to-length ratio of a channel region of a driving transistor in the third-color sub-pixel region.

16. The array substrate according to claim 15, wherein the plurality of sub-pixel regions further comprise a white sub-pixel region; and
   an area of the white sub-pixel region is smaller than the area of the blue sub-pixel region.

17. A display panel, comprising the array substrate according to claim 15.

18. A display device, comprising the display panel according to claim 17.

19. The array substrate according to claim 15, wherein the first-color sub-pixel region is a red sub-pixel region, the second-color sub-pixel region is a green sub-pixel region, and the third-color sub-pixel region is a blue sub-pixel region.

20. An array substrate, comprising:
   a base substrate; and
   a plurality of sub-pixel regions on the base substrate;

wherein each of the sub-pixel regions comprises:
a pixel driving circuit;
a white electroluminescent device connected with the pixel driving circuit; and
a color resist layer corresponding to the each sub-pixel region;
wherein different sub-pixel regions correspond to different color resist layers with different colors;
wherein the plurality of sub-pixel regions at least comprise:
a first-color sub-pixel region;
a second-color sub-pixel region; and
a third-color sub-pixel region; and
wherein an area of the first-color sub-pixel region is greater than an area of the second-color sub-pixel region, and the area of the second-color sub-pixel region is greater than an area of the third-color sub-pixel region; and
light emitting brightness of the first-color sub-pixel region, the second-color sub-pixel region, and the third-color sub-pixel region are substantially consistent under drive of a same data voltage.

* * * * *